(12) United States Patent
Wang et al.

(10) Patent No.: US 11,971,376 B2
(45) Date of Patent: Apr. 30, 2024

(54) SOLID-STATE NUCLEAR MAGNETIC RESONANCE (SSNMR) METHOD FOR DETECTING HYDROGEN BOND STRUCTURE

(71) Applicant: EAST CHINA UNIVERSITY OF SCIENCE AND TECHNOLOGY, Shanghai (CN)

(72) Inventors: Shenlin Wang, Shanghai (CN); Sha Zhao, Shanghai (CN)

(73) Assignee: East China University of Science and Technology, Shanghai (CN)

( * ) Notice: Subject to any disclaimer, the term of this patent is extended or adjusted under 35 U.S.C. 154(b) by 111 days.

(21) Appl. No.: 17/951,411

(22) Filed: Sep. 23, 2022

(65) Prior Publication Data
US 2023/0228696 A1    Jul. 20, 2023

(30) Foreign Application Priority Data

Sep. 26, 2021 (CN) .......................... 202111126968.5

(51) Int. Cl.
    *G01N 24/08*      (2006.01)
(52) U.S. Cl.
    CPC .................................. *G01N 24/087* (2013.01)
(58) Field of Classification Search
    CPC ................ G01R 33/46–465; G01N 24/08–088
    USPC ................................................. 324/307–315
    See application file for complete search history.

(56) References Cited

U.S. PATENT DOCUMENTS

| 6,184,683 B1 * | 2/2001 | Emsley ............ G01R 33/4641 324/309 |
| 2004/0017194 A1 * | 1/2004 | Saalwachter ...... G01R 33/4641 324/309 |

FOREIGN PATENT DOCUMENTS

CN      110441344 A    * 11/2019

OTHER PUBLICATIONS

Wang; Translation of CN 110441344 A; Nov. 12, 2019; Translation by Clairivate (Year: 2019).*
Chinese Office Action in Application No. 2021111126968.5, Document No. 2024011001580330, 5 pages, dated Jan. 10, 2024.

* cited by examiner

*Primary Examiner* — Steven L Yeninas
*Assistant Examiner* — Rahul Maini
(74) *Attorney, Agent, or Firm* — Rankin, Hill & Clark LLP (57) ABSTRACT

An experimental technology for detecting a hydrogen bond based on an ssNMR technology includes: (1) exciting a $^1$H nucleus of an RNA sample with a $\pi/2$ pulse; (2) applying two $\pi$ pulses every half rotation period on an X nucleus of the RNA sample; (3) applying a $\pi$ pulse on the $^1$H nucleus of the RNA sample; (4) applying two $\pi$ pulses every half rotation period on the X nucleus of the RNA sample; (5) applying a 90° pulse on $^1$H and X atoms of the RNA sample; r a chemical shift of X in indirect dimension; (7) applying the 90° pulse on the $^1$H and X nuclei of the RNA sample; (8) repeating steps 2, 3, and 4; and (9) collecting the $^1$H signal in direct dimension; where X is selected from the group consisting of $^{15}$N and $^{13}$C.

20 Claims, 12 Drawing Sheets

Specification includes a Sequence Listing.

SEQUENCE LISTING

```
Sequence total quantity: 3
SEQ ID NO: 1           moltype = RNA  length = 30
FEATURE                Location/Qualifiers
source                 1..30
                       mol_type = other RNA
                       note = RNA gel
                       organism = synthetic construct
SEQUENCE: 1
ggggccgggg ccggggccgg ggccggggcc                                    30

SEQ ID NO: 2           moltype = DNA  length = 48
FEATURE                Location/Qualifiers
source                 1..48
                       mol_type = other DNA
                       note = R strand
                       organism = synthetic construct
SEQUENCE: 2
ggccccggcc ccggccccgg ccccggcccc tatagtgagt cgtattaa                 48

SEQ ID NO: 3           moltype = DNA  length = 48
```

```
FEATURE         Location/Qualifiers
source          1..48
                mol_type = other DNA
                note = F strand
                organism = synthetic construct
SEQUENCE: 3
ttaatacgac tcactatagg ggccggggcc ggggccgggg ccggggcc              48
```

SOLID-STATE NUCLEAR MAGNETIC RESONANCE (SSNMR) METHOD FOR DETECTING HYDROGEN BOND STRUCTURE

CROSS REFERENCE TO RELATED APPLICATION

This patent application claims the benefit and priority of Chinese Patent Application No. 202111126968.5, filed on Sep. 26, 2021, the disclosure of which is incorporated by reference herein in its entirety as part of the present application.

REFERENCE TO AN ELECTRONIC SEQUENCE LISTING

The contents of the attached electronic sequence listing (entitled: "GWP20220700291_seqlist.xml"; Size: 4,336 bytes; and Date of Creation: Mar. 10, 2023) is herein incorporated by reference in its entirety.

TECHNICAL FIELD

The present disclosure relates to the field of solid-state nuclear magnetic resonance (ssNMR) spectroscopy, in particular to an experimental technology for detecting a hydrogen bond based on an ssNMR technology.

BACKGROUND ART

A hydrogen bond (or H-bond) is a primarily electrostatic force of attraction between a hydrogen (H) atom which is covalently bound to a more electronegative "donor" atom or group, and another electronegative atom bearing a lone pair of electrons—the hydrogen bond acceptor. The hydrogen bond is generally denoted X—H . . . Y, where X and Y can be (N), oxygen (O), and fluorine (F) atoms. The hydrogen bond plays an important role in molecular interactions and affects the structure, function and dynamic characteristics of substances. For example, in supramolecular chemistry, hydrogen bonds can precisely control and guide molecular structures; in biological macromolecules, such as ribonucleic acids and proteins, the hydrogen bonds are the basic building block of the structures. Through the hydrogen bonds, complex secondary and tertiary structures can be formed in biological macromolecules to exert physiological functions. The hydrogen bond has attracted extensive interest of researchers since its discovery. Direct observation of hydrogen bonds and measurements of hydrogen bond strengths are important research topics in many disciplines, such as materials science, chemistry (inorganic and organic chemistry, supramolecular chemistry, and biochemistry), molecular medicine, and pharmacy. Therefore, it is crucial to detect the hydrogen bond.

The current research methods of detecting the hydrogen bonds are classified into X-ray crystal diffraction, neutron diffraction, infrared spectroscopy, and nuclear magnetic resonance. In the X-ray crystal diffraction, the samples should form a regular single crystal. Therefore, the X-ray crystal diffraction is not suitable for samples that are difficult to be crystallized. In addition, the X-ray crystal diffraction does not allow direct observation of hydrogen atoms. The neutron diffraction can help detect molecular vibration, but is not widely used currently. The infrared spectroscopy can be used to study a hydrogen bonding mode, but cannot provide site-specific information. Nuclear magnetic resonance can provide rich structural information and has a wide range of applications, but still faces difficulties such as lack of universal detection methods to observe the hydrogen bonds. Therefore, in the present disclosure, a solid-state nuclear magnetic resonance (ssNMR) method is proposed for the specific detection of N—H . . . N and N—H . . . O═C hydrogen bonds.

The ssNMR can provide structural information of solid samples in an atomic scale, is applicable to characterize samples in diverse forms, has no limitation on molecular weight, and features non-destructive detection. The ssNMR has outstanding advantages in the study of protein-protein and protein-nucleic acid complexes with low solubility and/or undergoing biological phase transitions. At present, there are several ssNMR techniques for hydrogen bond structure analysis, including two-dimensional $^{15}$N—$^{15}$N RFDR experiments and two-dimensional proton-detected $^{15}$H—$^{15}$N hCN(PAR)NH experiments. The two-dimensional RFDR experiments indirectly prove the N—H . . . N hydrogen bond by collecting a $^{15}$N—$^{15}$N two-dimensional spectrum to obtain correlation of the $^{15}$N atoms close to each other, but cannot directly prove existence of the hydrogen bond. Moreover, the method uses $^{15}$N detection with a low sensitivity. The two-dimensional proton-detected $^{1}$H—$^{15}$NhCN(PAR)NH experiments realize the transfer of $^{15}$N—$^{15}$N using a proton-assisted recoupling (PAR) mechanism. The detection of N—H . . . N hydrogen bond can be achieved by optimizing parameters based on the proposed hydrogen bond structure, such as the length and the angle of the N—H . . . N hydrogen bond. However, it is difficult to optimize the transfer efficiency of the PAR experiments, making it difficult to apply the two-dimensional proton-detected $^{1}$H—$^{15}$N hCN(PAR)NH experiments into the hydrogen bond observation. Therefore, existing ssNMR methods that can detect the hydrogen bond still face technical bottlenecks such as low accuracy, poor sensitivity, and difficult experimental setup. Based on this, the present disclosure aims to develop an ssNMR method with a high sensitivity, an excellent accuracy, and simple setup for specific detection of the hydrogen bond.

SUMMARY

In view of this, the present disclosure provides an ssNMR method for detecting a hydrogen bond structure, including the following steps: (1) exciting a $^{1}$H nucleus of an RNA sample with a $\pi/2$ pulse; (2) applying two $\pi$ pulses every half rotation period on an X nucleus (X=$^{15}$N or $^{13}$C) of the RNA sample; (3) applying a $\pi$ pulse on the $^{1}$H nucleus of the RNA sample; (4) applying two TT pulses every half rotation period on the X nucleus of the RNA sample; (5) applying a 90° pulse on $^{1}$H and X of the RNA sample; (6) recording a chemical shift of X in indirect dimension; (7) applying the 90° pulse on the $^{1}$H and X nuclei of the RNA sample; (8) repeating steps 2, 3, and 4; and (9) collecting the $^{1}$H signal in direct dimension; where X is selected from the group consisting of $^{15}$N and $^{13}$C.

In a specific example, the $^{1}$H nucleus may be applied with 1.9 is of the $\pi/2$ pulse and 3.8 µs of the $\pi$ pulse.

In a specific example, the $^{15}$N nucleus may be applied with 9.2 µs of the a pulse.

in a specific example, the $^{13}$C nucleus may be applied with 7.0 µs of the a pulse.

In a specific example, the method may further include the following steps between steps (1) and (2): applying $^{1}$H—$^{15}$N cross-polarization (CP); applying a shape pulse on the $^{15}$N nucleus; suppressing a water signal with a MISSISIPPI pulse sequence; and applying $^{15}N-^{1}H$ CP.

In a specific example, $^{1}H-^{15}N$ CP may be applied at a contact time of 1 ms, a $^{15}N$ constant field lock at 50 kHz, and a $^{1}H$ constant field lock at 90 kHz.

In a specific example, the shape pulse may be applied on the $^{15}N$ nucleus at an excitation time of 625 µs.

In a specific example, $^{15}N-^{1}H$ CP may be applied at a contact time of 300 µs, a $^{15}N$ constant lock field at 50 kHz, and a $^{1}H$ constant lock field at 90 kHz.

In a specific example, the shape pulse may be selected from the group consisting of Q3, GAUSSI, SQUARE, SINC, RSONB, REBurp, CRP, and REBURP.

In the present disclosure, the method has the following advantages: (1) a proton-detected technology is adopted with a high sensitivity; (2) a $^{1}H-^{15}N$ two-dimensional spectrum is constructed to observe correlation signals with a high accuracy; (3) the $^{1}H-^{15}N$ TEDOR pulse parameter setting is simple without need to optimize according to the angle and the bond length of the hydrogen bond; (4) acquisition of the $^{1}H$ atoms is correlated to a chemical shift of two nitrogen atoms in the hydrogen bond, and the hydrogen bond can be directly observed at atomic level; (5) through the combination of selective pulses and TEDOR pulses, the overlapping of spectra is effectively reduced; and (6) in the N—H . . . N hydrogen bond, N—H ligated by chemical bonds has a distance of about 1.0 Å, and H and N atoms ligated by hydrogen bonds has a distance of about 1.9 Å. Therefore, with the $^{1}H-^{15}N$ TEDOR experiment and by setting different mixing times, N—H groups ligated by chemical bonds, as well as H and N atoms ligated by hydrogen bonds, are detected for structural identification and characterization.

DETAILED DESCRIPTION OF THE EMBODIMENTS

The present disclosure is further described below with reference to examples, which are not intended to limit the present disclosure. Various changes and modifications can be made to the present disclosure by those skilled in the art. Any modifications, equivalent replacements, improvements, etc. made within the spirit and principle of the present disclosure should be included within the protection scope of the claims of the present disclosure.

In order to realize the detection of intramolecular or intermolecular hydrogen bonds, the present disclosure provides a series of ssNMR methods for detecting N—H . . . N and N—H . . . O═C. hydrogen bonds under a fast magic angle spinning (MAS). That is, two-dimensional (2D) proton detection $^{1}H$—X(X=$^{15}N$ or $^{13}C$) transferred-echo double resonance (TEDOR), which is also known as $^{1}H-^{15}N$TEDOR and $^{1}H-^{13}C$ TEDOR, as well as TEDOR-related experiments incorporating a selective pulse strategy (namely $^{1}H-^{15}N$-hNH-(FSL)-[$^{1}H,^{15}N$]-TEDOR and $^{1}H-^{1}C$-hNH-(FSL)-[$^{1}H,^{13}C$]-TEDOR) are used.

A key design of the TEDOR experiment includes: through two rotational echo double resonance (REDOR) modules, the transfer of $^{1}H$ to $^{15}N$ or $^{13}C$ and the transfer of $^{15}N$ or $^{13}C$ to $^{1}H$ are achieved to establish a $^{1}H-^{15}N$ or $^{1}H-^{13}C$ two-dimensional chemical shift-correlated spectrum, so as to obtain correlation information between the H atoms and atoms on both sides of the hydrogen bond, thereby directly observing the hydrogen bond. REDOR is a pulse sequence of heteronuclear dipole recoupling under MAS conditions; under the MAS conditions, the dipole coupling effect of phase-coupled spin pairs is averaged by the MAS. In the evolution period of a detection nucleus (such as $^{1}H$), a n pulse is applied to a channel of the coupling nucleus (X, X=$^{15}N$ or $^{13}C$) every half of rotation period, such that the heteronuclear dipole coupling effect is not averaged by the MAS, and the single quantum coherence of $^{1}H$ ($^{1}Hx$) evolves into a $^{1}H$—X multi-quantum coherence ($^{1}HyXz$). The optimal evolution time is related to a distance between the $^{1}H$ and X atoms. By adjusting the total evolution time, a hydrogen atom and the X atoms on both sides of the hydrogen atom (X=$^{15}N$ or $^{13}C$) can be detected separately. After recording the chemical shift of X, $^{1}HyXz$ is transformed into $^{1}Hx$ by a REDOR module, and direct dimension sampling is conducted on $^{1}H$.

In addition to 2D$^{1}H$—X TEDOR, in the present disclosure, a selective pulse is combined with the TEDOR for the first time. Selective pulses can filter out specific signals through spectral editing. In the present disclosure, a spectral editing method includes a cross-polarization (CP) experiment selected based on a contact time in a CP process, and a pulse sequence selected based on the frequency.

By combining the CP pulse, frequency selective pulses (FSLs) and TEDOR block, $^1$H-$^{15}$N-hNH-(FSL)-[$^1$H,$^{15}$N]-TEDOR and $^1$H-$^{13}$C-hNH(FSL)-[$^1$H,$^{13}$C]-TEDOR pulses. The magnetic resonance signals are transferred by $^1$H-$^{15}$N CP in an hNH pulse; the frequency of $^{15}$N is selected, and signals of a specific frequency are only retained, so as to select the $^{15}$N signals with a specific chemical shift; furthermore, the $^{15}$N signals with a specific chemical shift are transmitted to chemically-bonded $^1$H signals through the $^1$H—$^{15}$N CP of short contact time. Therefore, only imino or amino signals of specific chemical shifts are retained by an hNH(FSL) pulsing module. Finally, the $^1$H—$^{15}$N or $^1$H—$^{13}$C two-dimensional spectrum is constructed by $^1$H—X TEDOR to realize specific detection of the N—H . . . N and N—H . . . O=C hydrogen bonds. Compared with $^1$H—X TEDOR, these two pulses can realize the specific detection of hydrogen bonds involving certain imino and amino groups (such as the imino groups of guanine and uridine, and the amino groups of guanine, cytosine, and adenine), which can effectively avoid interference of other signals to further improve an accuracy of hydrogen bond detection.

In addition, in the present disclosure, by using the fast MAS condition (40 kHz), a transverse relaxation time of $^1$H is significantly longer than that of medium- and low-speed MAS condition, which effectively reduces the signal loss during $^1$H—X evolution, thereby improving a sensitivity of the experiment.

The present disclosure is achieved by the following technical solutions:

A ssNMR method for detecting a hydrogen bond structure includes the following steps:

(1) A sample to be tested is prepared, including a $^{15}$N or $^{13}$C label.

(2) A pulse sequence is set, including the following steps:

For the 2D$^{15}$H—X TEDOR pulse (X=$^{15}$N or $^{13}$C), the following operations are conducted: a $^1$H nucleus is excited with a π/2 pulse, and then a π pulse is applied to an X nucleus every half rotation period for a certain number of π pulses; the π pulse is applied in a $^1$H channel to suppress the $^1$H chemical shift anisotropy and the $^1$H chemical shift evolution of $^1$H during the $^1$H—X evolution; the πpulse is repeatedly applied on the X channel every half rotation period, with the number equal to that of the π pulse on the X channel in front of the $^1$H π pulse; after the above step, the $^1$H channel is locked to suppress the solvent signal; a 90° pulse is applied on the $^1$H and X atoms, respectively, and a chemical shift (t1) is recorded in an X dimension, and a 90° pulse is applied on the $^1$H and X atoms, respectively, after the recording is completed. After completing the above operations for the two groups of REDOR pulse sequences, the $^1$H signal is collected, and the $^1$H—X two-dimensional spectrum is constructed.

For the $^1$H-$^{15}$N-hNH-(FSL)-[$^1$H,$^{15}$N]-TEDOR pulse and $^1$H-$^{13}$C-hNH-(FSL)-[$^1$H,$^{13}$C]-TEDOR pulse, the following operations are conducted: the $^1$H nucleus is excited with the z/2 pulse, $^1$H-$^{15}$N CP realizes the polarization of $^{15}$N nucleus with a low sensitivity, and a contact time is set to 1 ms to 10 ms; with a shape pulse, the $^{15}$N off-set and a pulse length are adjusted, a $^{15}$N signal with specific chemical shift is selected; the $^{15}$N signal is transferred to a $^1$H linked by a H—N chemical bond, and a contact time is set to 100 μs to 1,000 μs. The subsequent $^1$H—X TEDOR module design is consistent with the other experiments described above.

(3) The sample is detected using an ssNMR spectrometer to obtain a two-dimensional spectrum of the sample.

(4) According to the two-dimensional spectrum of the sample, signals in the spectra at different mixing times are compared to determine whether there is a NH . . . N or N—H . . . O=C hydrogen bond.

The sample is a biological macromolecule or other substances containing hydrogen bonds, where the biological macromolecule includes DNAs, RNAs, and nucleic acid-protein complexes; and the other substances containing hydrogen bonds from N—H . . . N or N—H . . . O=C include, but are not limited to, N-containing soft substances, biological materials, and polymer materials.

The sample includes a solid sample, a gel sample or a sedimentation soluble sample.

Preparation methods of a RNA sample include in vitro transcription, solid-phase synthesis, or biological extraction.

When preparing the RNA sample, the RNA sample is purified by polyacrylamide gel electrophoresis.

A water signal is suppressed by pulsing on $^1$H to suppress the solvent signals.

In $^1$H-$^{15}$N-hNH(FSL)-[$^1$H,$^{15}$N]-TEDOR and $^1$H-$^{13}$C-hNH-(FSL)-[$^1$H,$^{13}$C]-TEDOR pulses, the shape pulses used is selected from the group consisting of Q3, GAUSSI, SQUARE, SING, RSONB, REBurp, CRP, and REBURP.

EXAMPLE 1

In this example, the pulse sequence was tested using an RNA gel formed by (GGGGCC)$_5$ sequence as a model. The GGGGCC sequence was part of a (0.790RF'72 gene, with repeat expansion associated with various neurodegenerative diseases. Studies had shown that repeat-expanded GGGGCC RNA might form RNA gels under specific conditions, and its structure had not been determined. The RNA gel formed by (GGGGCC)$_5$ sequence was analyzed for the first time using ssNMR methods.

1. Preparation of RNA Samples (1) Construction of DNA Template

In this example, (GGGGCC), RNA was obtained by an in vitro transcription method, and a corresponding DNA template was designed according to the target RNA. The DNA template included two complementary DNA single strands, namely a forward strand (R strand) and a reverse strand (F strand), and sequences were as follows:

R strand (SEQ ID NO: 2):
5'-GGCCCCGGCCGCGGCCCCGGCCCCGGCCGCT-ATAGTGAGTCGTATTAA-3'

F strand (SEQ ID NO: 3):
5'-TTAATACGACTCACTATAGGGGCCGGGGCCGG-GGCCGGGGCCGGGGCC-3'

The single-stranded DNA was centrifuged, dissolved, and annealed by heating to form a linear double-stranded DNA template (with a final concentration of 25 μM).

(2) RNA Samples Preparation by In Vitro Transcription

In the present disclosure, two RNA samples were prepared, namely $^{13}$C,$^{15}$N isotopes-uniformly labeled (GGGGCC)$_3$RNA and mixed labeled (GGGGCC)$_3$RNA prepared by adding $^{13}$C.-labeled GTP and $^{15}$N-labeled GTP separately.

$^{13}$C,$^{15}$N isotopes-uniformly labeled (GGGGCC)$_3$RNA samples were prepared by 5 mL of an in vitro transcription system: 2,600 μL of DEPC-treated water, 665 μL of 100 mM$^{13}$C,$^{15}$N isotope-labeled GTP, 335 μL of 100 mM$^{13}$C, $^{15}$N isotope-labeled CTP, 500 μL of Tris buffer (containing 400 mM Tris/HCl, pH 8.0, 10 mM Spermidine, 0.1% Triton X-100), 50 μL of 1 M dithiothreitol (DTT), 200 μl. of 1 M MgCl$_2$, 150 μL of 25 μM DNA template, and 500 μt, of 2 mg/mL T7 RNA polymerase were sequentially added to a 50 mL centrifuge tube. Incubation was conducted in a 37° C. water bath for 24 h to ensure complete reaction of the starting materials.

Mixed-labeled (GGGGCC)$_5$RNA was prepared by 5 mL of an in vitro transcription system: 2,600 μL of DEPC-treated water, 330 μL of 100 mM$^{13}$C isotope-labeled GTP, 330 μL of 100 mM $^{13}$N isotope-labeled GTP, 340 μL. of non-isotopo-labeled CTP, 500 μL of Tris buffer (containing 400 mM Tris/HCl, pH 8.0, 10 mM Spermidine, 0.1% Triton X-100), 50 μL of 1 M dithiothreitol (DTT), 200 μL of 1 M MgCl$_2$, 150 μL of 25 μM DNA template, and 500 μL of 2 mg/mL T7 RNA polymerase were sequentially added to a 50 mL centrifuge tube. Incubation was conducted in a 37° C. water bath for 24 h to ensure complete reaction of the starting materials. GTP in the resulting mixed-labeled (GGGGCC)RNA samples was either $^{13}$C-labeled or $^{15}$N-labeled only.

(3) RNA Purification

After the transcription reaction was completed, the RNA was purified by 12% polyacrylamide gel electrophoresis (PAGE), and a target band was obtained by cutting a gel under UV light after the electrophoresis. The band containing the target RNA was soaked in an extraction buffer (20 mM Tris-HCl, 300 mM sodium acetate, and 1 mM EDTA, pH 7.4) at 37° C. for about 12 h, and a solution was collected.

(4) Preparation of RNA Gel Samples

A (GGGGCC)$_5$RNA sample was dissolved in a solution containing 5 mM Tris (pH=7.0) and 10 mM MgCl$_2$ by ultrafiltration, heated at 95° C. for 3 min, and then cooled down to 37° C. in a gradient manner at 3° Chain, to obtain the RNA gel samples.

2. Pulse Sequence Setup and Method for Detecting Hydrogen Bond

2D$^1$H-$^{15}$N TEDOR, 2D$^1$H-$^{13}$C TEDOR, 2D$^1$H-$^{15}$N-hNH-(FSL)-[$^1$H,$^{15}$N]-TEDOR, and 2D$^1$H-$^{13}$C-hNH-(FSL)-[$^1$H,$^{13}$C]-TEDOR experiments each were completed at a MAS of 40 kHz, and one rotation period was 25 As, and half a rotation period was 12.5 μs. In this example, π/2 had the same definition as 90°, and x had the same definition as 180°. In this example, an ssNMR instrument was used.

Figure 1A:
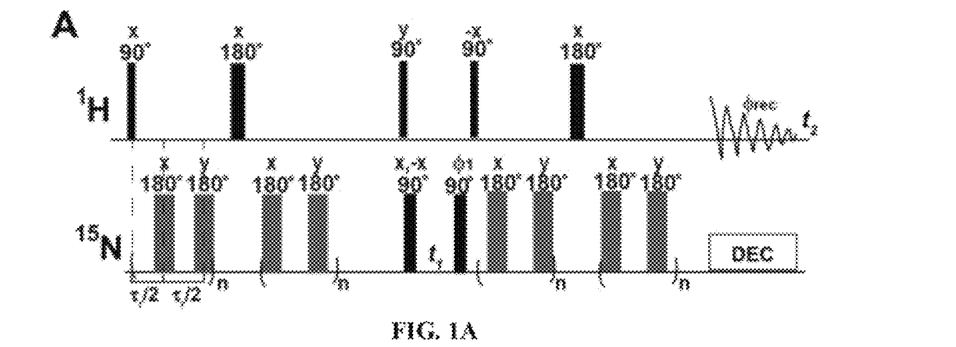
FIG. 1A shows a schematic diagram of a two-dimensional $^{1}H-^{15}N$ TEDOR pulse sequence; where Φ1=x,x,x,x; x,v,−x; x; Φrec=x; x, x, −x, −x, x, −x, x; π/2 represents half a rotation period.

The 2D'H-$^{15}$N TEDOR pulse sequence (FIG. 1A) was set up as follows:
a $^1$H nucleus of the RNA sample was excited with a π/2 pulse, and
2 π pulses were applied to a $^{15}$N nucleus of the RNA sample every half rotation period;
$^1$H chemical shift anisotropy and $^1$H chemical shift evolution of 'H during'H-$^{15}$N evolution
were suppressed by applying a n pulse to the $^1$H nucleus of the RNA sample;
2 π pulses were applied to the $^{15}$N nucleus of the RNA sample every half rotation period;
a 90° pulse was separately applied on the $^1$H and $^{15}$N nuclei of the RNA sample,
The $^{15}$N chemical shift was recorded in the indirect dimension
The 90° pulse was separately applied on the $^1$H and $^{15}$N nuclei of the RNA sample.
REDOR pulse sequence: a total of 2 π pulses were applied to the $^{15}$N nucleus every half rotation period; the π pulse was applied on the $^1$H nucleus to suppress $^1$H chemical shift anisotropy and $^1$H chemical shift evolution of $^1$H during $^1$H-$^{15}$N evolution; a total of 2 π pulses were applied on the $^{15}$N nucleus every half rotation period;

After completing the above operations for the two groups of REDOR pulse sequences, the $^1$H signal was collected, and the $^1$H-$^{15}$N two-dimensional spectrum was constructed.

Referring to FIG. 1A, the number of Tt pulses was controlled by adjusting a value of n in the experiment. When n=1, a total of 8 π pulses were applied to the $^{15}$N nucleus, with a total evolution time of 100 μs. When n was an integer greater than 1, a total of 8n R pulses were applied to the $^{15}$N nucleus, with a total evolution time of 100n μs.

In this experiment, the direct dimension (F1: $^1$H) and the indirect dimension (F2: $^{15}$N) took 958 points and 128 points in t evolution period and t2 acquisition period, respectively.

The π/2 pulse applied to the $^1$H nucleus was 1.9 is, and the π pulse applied to the $^1$H nucleus was 3.8 its, and The π/2 pulse applied on the $^{15}$N nucleus was 4.6 μs, and the π pulse applied on the $^{15}$N nucleus was 9.2 μs.

A recycle waiting time was 2 s.

The 2D$^1$H-$^{13}$C TEDOR pulse sequence (FIG. 1B) was set up as follows:
a $^1$H nucleus of the RNA sample was excited with a π/2 pulse, and
2 π pulses were applied to a $^{13}$C nucleus of the RNA sample every half rotation period;
$^1$H chemical shift anisotropy and $^1$H chemical shift evolution of 'H during' H-$^{13}$C evolution were suppressed by applying a π pulse to the $^1$H nucleus of the RNA sample;
2 π pulses were applied to the $^{13}$C nucleus of the RNA sample every half rotation period;
a 90° pulse was separately applied on the $^1$H and $^{13}$C nuclei of the RNA sample,
a chemical shift t1 was recorded in a $^{13}$C dimension, and the 90° pulse was separately applied on the $^1$H and $^{13}$C nuclei of the RNA sample.

Figure 1B:
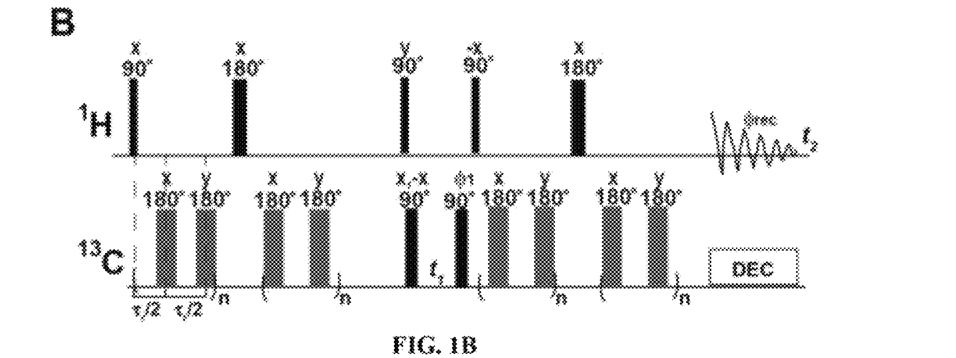
FIG. 1B shows a schematic diagram of a two-dimensional $^{1}H-^{13}C$ TEDOR pulse sequence; where Φ1=x,x,x,x, −x, −x, −x, x; Φrec°°°x, −x,x, −x,−x,x; x,x; π/2 represents half a rotation period.

REDOR pulse sequence: a total of 2 π pulses were applied to the $^{13}$C nucleus of the RNA sample every half rotation period; the π pulse was applied on the $^1$H nucleus of the RNA sample to suppress $^1$H chemical shift anisotropy and $^1$H chemical shift evolution of H during $^1$H-$^{13}$C evolution; a total of 2 π pulses were applied on the $^{13}$C nucleus every half rotation period;

After completing the above operations for the two groups of REDOR pulse sequences, the $^1$H signal was collected, and the $^1$H-$^{13}$C two-dimensional spectrum was constructed.

Referring to FIG. 1B, the number of π pulses was controlled by adjusting a value of n in the disclosure experiment. When n=1, a total of 8 π pulses were applied to the $^{13}$C nucleus, with a total evolution time of 100 μs. When n was an integer greater than 1, a total of 8n π pulses were applied to the $^{13}$C nucleus, with a total evolution time of 100n μs.

In this experiment, the direct dimension (F1: $^1$H) and the indirect dimension (F2: $^{13}$C) took 958 points and 128 points in t1 evolution period and t2 acquisition period, respectively.

The π/2 pulse applied to the $^1$H nucleus was 1.9 μs, and the π pulse applied to the $^1$H nucleus was 3.8 As, and The π/2 pulse applied on the $^{13}$C nucleus was 3.5 its, and the π pulse applied on the $^{13}$C nucleus was 7.0 μs.

A recycle waiting time was 2 s.

Figure 1C:
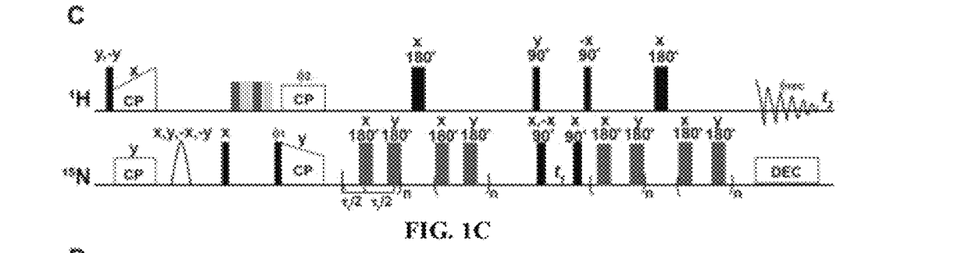
FIG. 1C shows a schematic diagram of a two-dimensional $^{1}H-^{15}N$—hNH(FSL)-[$^{1}H,^{15}N$]-TEDOR pulse sequence; where Φ1=x,x,−x; x; 2=y,y,y,y, −y,−y,−y,−y; Φrec=y,−y; y,y,−y,y,y,−y; π/2 represents half a rotation period.

The 2D$^1$H-$^{15}$N-hNH-(PSE)-[$^1$H,$^{15}$N]-TEDOR pulse sequence (FIG. 1C) was set up as follows:
a $^1$H nucleus of the RNA sample was excited with a π/2 pulse, and In a specific example, $^1$H-$^{15}$N CP was applied at a contact time of 1 ms, a $^{15}$N constant field lock at 50 kHz, and a $^1$H constant field lock at 90 kHz;

a shape pulse was applied to the $^{15}$N nucleus at an excitation center of 90 ppm and a excitation time of 625 Its, and a $^{15}$N signal at a specific chemical shift was selected;

a water signal was suppressed with a MISSISIPPI pulse sequence; and $^{15}$N-$^1$H CP was applied at a contact time of 300 μs, a $^{15}$N constant field lock at 50 kHz, and a $^1$H constant field lock at 90 kHz, and the $^{15}$N signal was transferred to the $^{15}$N-chemically bonded nucleus.

2 π pulses were applied to a $^{15}$N nucleus of the RNA sample every half rotation period;

$^1$H chemical shift anisotropy and $^1$H chemical shift evolution of H during $^1$H-$^{15}$N evolution were suppressed by applying a π pulse to the $^1$H nucleus;

2 π pulses were applied to the $^{15}$N nucleus every half rotation period;

a 90° pulse was separately applied on the $^1$H and $^{15}$N nuclei, and the $^{15}$N chemical shift was recorded in the indirect dimension, and the 90° pulse was separately applied on the $^1$H and $^{15}$N nuclei.

REDOR pulse sequence: a total of 2 π pulses were applied to the $^{15}$N nucleus every half rotation period; the π pulse was applied on the $^1$H nucleus to suppress $^1$H chemical shift anisotropy and $^1$H chemical shift evolution of $^1$H during $^1$H-$^{15}$N evolution; a total of 2 π pulses were applied on the $^{15}$N nucleus every half rotation period;

After completing the above operations for the two groups of REDOR pulse sequences, the $^1$H signal was collected, and the $^1$H-$^{15}$N two-dimensional spectrum was constructed.

The number of π pulses was controlled by adjusting a value of n in the disclosure experiment. When n=1, a total of 8 π pulses were applied to the $^{15}$N nucleus, with a total evolution time of 100 Its. When n was an integer greater than 1, a total of 8n π pulses were applied to the $^{15}$N nucleus, with a total evolution time of 100n μs.

In this experiment, the direct dimension (F1: $^1$H) and the indirect dimension (F2: $^{15}$N) took 958 points and 80 points in t1 evolution period and t2 acquisition period, respectively.

The π/2 pulse applied to the $^1$H nucleus was 1.9 μs, and the π pulse applied to the $^1$H nucleus was 3.8 As, and The π/2 pulse applied on the $^{15}$N nucleus was 4.6 its, and the pulse applied on the $^{15}$N nucleus was 9.2 μs.

A recycle waiting time was 2 s.

Figure 1D:
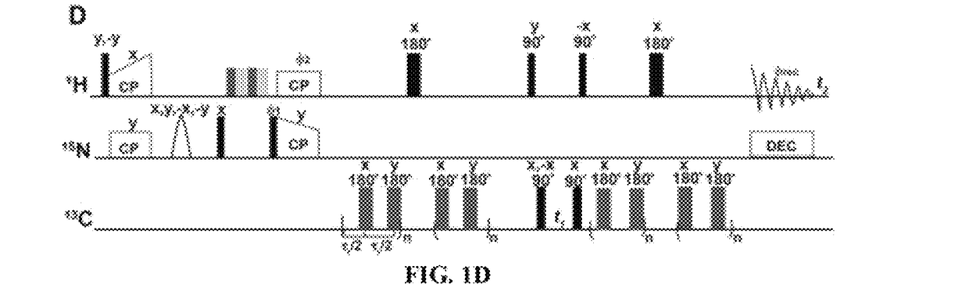
FIG. 1D shows a schematic diagram of a two-dimensional $^{1}H-^{13}C$-hNH(FSL)-[$^{1}H,^{13}C$]-TEDOR pulse sequence; where Φ1=x,x, x, x; Φ2=y,y,y,y, −y,−y,−y,−y; =y, y,−y,y, y,y,y; π/2 represents half a rotation period.

The shape pulse was Gaus1_180i.1000,

The 2D'H-$^1$'C-hNH-(FSL)-[$^1$H,$^{13}$C]-TEDOR pulse sequence (FIG. 1D) was set up as follows:

a $^1$H nucleus of the RNA sample was excited with a π/2 pulse, and

In a specific example, $^1$H-$^{15}$N CP was applied at a contact time of 1 ms, a $^{13}$N constant field lock at 50 kHz, and a $^1$H constant field lock at 90 kHz.

a shape pulse was applied to the $^{15}$N nucleus at an excitation center of 150 ppm and a excitation time of 625 μs, and a $^{15}$N signal at a specific chemical shift was selected;

a water signal was suppressed with a MISSISIPPI pulse sequence; and $^{13}$N-$^1$H CP was applied at a contact time of 300 Its, a $^{13}$N constant field lock at 50 kHz, and a $^1$H constant field lock at 90 kHz, and the $^{15}$N signal was transferred to the $^{15}$N-chemically bonded $^1$H nucleus.

2 π pulses were applied to a $^{13}$C nucleus of the RNA sample every half rotation period;

$^1$H chemical shift anisotropy and $^1$H chemical shift evolution of $^1$H during $^1$H-$^{13}$C evolution were suppressed by applying air pulse to the $^1$H nucleus of the RNA sample;

2 π pulses were applied to the $^{13}$C nucleus of the RNA sample every half rotation period;

After completion, the hydrogen was locked for 500 is. The $^1$H constant field lock was 130 kHz, suppressing the solvent signal;

a 90° pulse was separately applied on the $^1$H and $^{13}$C nuclei,

The $^{13}$C chemical shift was recorded in the indirect $^{13}$C dimension, and the 90° pulse was separately applied on the $^1$H and $^{13}$C nuclei of the RNA sample.

REDOR pulse sequence: a total of 2 π pulses were applied to the $^{13}$C nucleus every half rotation period;

$^1$H chemical shift anisotropy and $^1$H chemical shift evolution during $^{13}$C evolution were suppressed by applying a R pulse to the nucleus;

A total of 2 π pulses were applied to the $^{13}$C nucleus every half rotation period;

After completing the above operations for the two groups of REDOR pulse sequences, the $^1$H signal was collected, and the $^1$H-$^{13}$C two-dimensional spectrum was constructed.

The number of π pulses was controlled by adjusting a value of n in the disclosure experiment. When n=1, a total of 8 π pulses were applied to the $^{13}$C nucleus, with a total evolution time of 100 μs. When n was an integer greater than 1, a total of 8n π pulses were applied to the IT nucleus, with a total evolution time of 100n μs.

In this experiment, the direct dimension (F1: $^1$H) and the indirect dimension (F2: $^{13}$C) took 958 points and 128 points in t1 evolution period and t2 acquisition period, respectively.

The π/2 pulse applied to the $^1$H nucleus was 1.9 μs, and the π pulse applied to the $^1$H nucleus was 3.8 μs, and The π/2 pulse applied on the $^{15}$N nucleus was 4.6 μs, and the π pulse applied on the $^{15}$N nucleus was 9.2 μs.

The π/2 pulse applied on the $^{13}$C nucleus was 3.5 μs, and the π pulse applied on the $^{13}$C nucleus was 7.0 is.

A recycle waiting time was 2 s.

The shape pulse was Gaus1_180i.1000,

3. Spectral Collection and Result Analysis

Figure 2A:
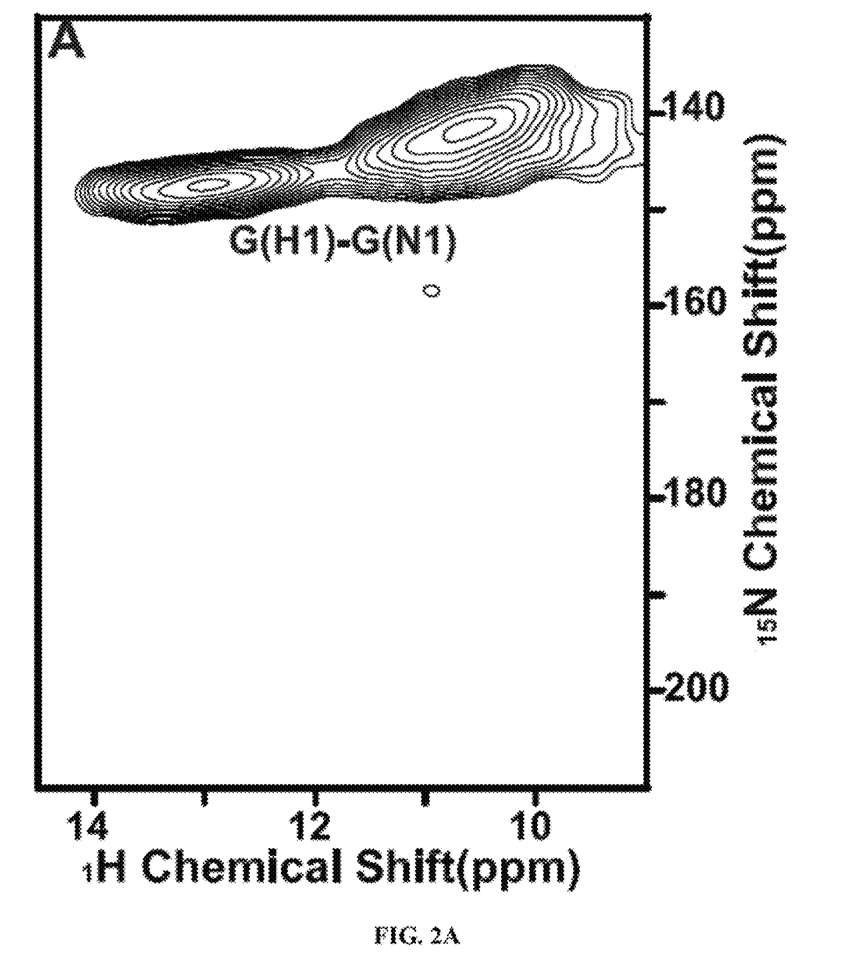
FIG. 2A shows a two-dimensional $^{1}H-^{15}N$ TEDOR spectrum of a $^{13}C,^{16}N$ isotopes-uniformly labeled (GGGGCC)$_5$ (SEQ ID NO: 1) RNA gel with a total evolution time of 100 µs (n=1)
Figure 2B:
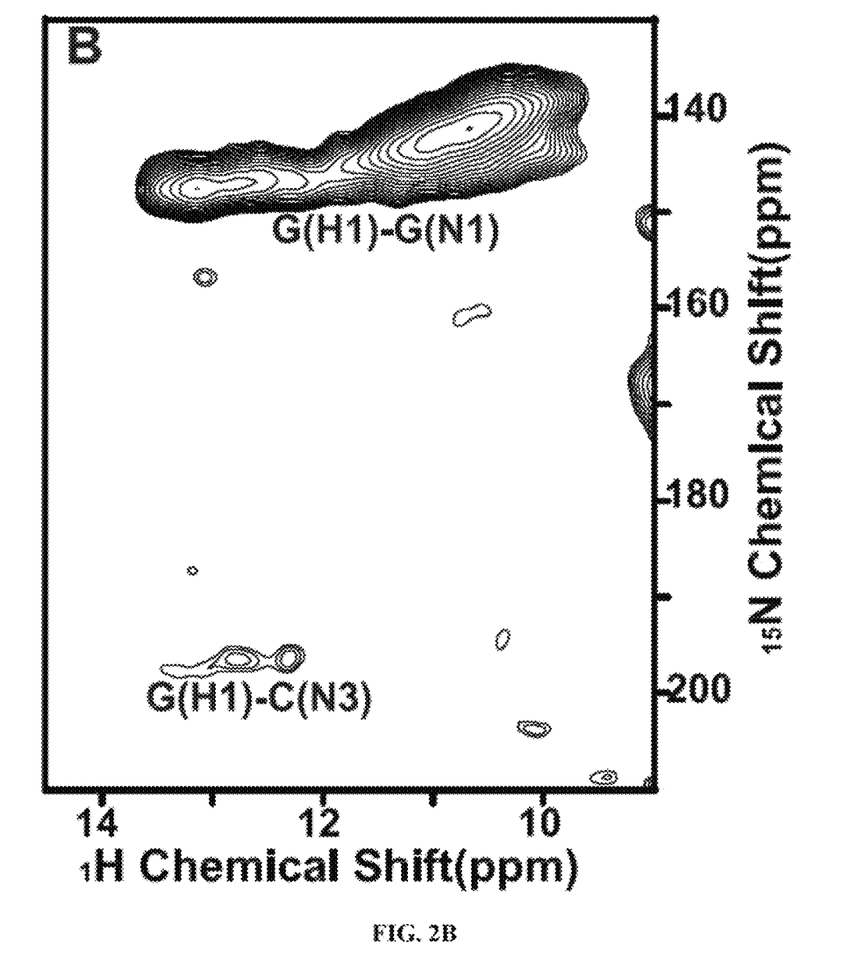
FIG. 2B shows a two-dimensional $^{1}H-^{15}N$ TEDOR spectrum of a $^{13}C,^{15}N$ isotopes-uniformly labeled (GGGGCC)$_5$ RNA gel with a total evolution time of 400 µs (n=4)
Figure 2C:
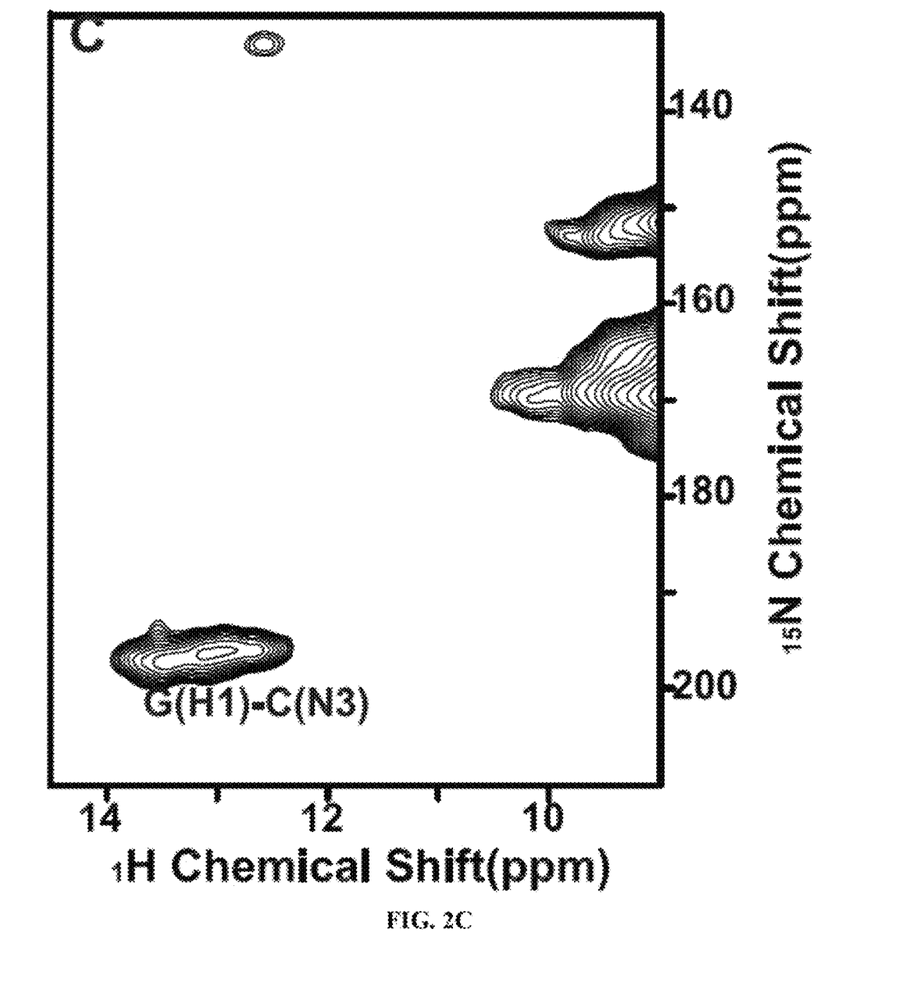
FIG. 2C shows a two-dimensional $^{1}H-^{15}N$ TEDOR spectrum of a $^{13}C,^{15}N$ isotopes-uniformly labeled (GGGGCC) sRNA gel with a total evolution time of 600 µs (n=6)

In the present disclosure, two-dimensional $^1$H-$^{15}$N TEDOR spectra of $^{13}$C,$^{15}$N isotopes-uniformly labeled (GGGGCC)sRNA gels were collected (FIG. 2A to FIG. 2C). The results were as follows: at a total evolution time of 100 μs (short mixing time), only signal peaks with $^1$H/$^{13}$N chemical shifts of 13 ppm/147.6 ppm and 10.6 ppm/142.0 ppm were observed, representing the N1-H1 cross peak of a guanine base, namely the intra guanine base NH signal. When the total evolution time was 400 μs, in addition to the internal cross peaks of the bases, the related information between the bases was observed, namely the signal peaks with $^1$H/$^{15}$N chemical shifts of 13 ppm/197 ppm, representing a cross peak of H1 in guanine base and the N3 in cytosine base, and proving the existence of N—H . . . N hydrogen bond between G-C base pair. In addition, when the total evolution time was extended to 600 μs (short mixing time), under the influence of relaxation, the intra guanine base NH signal disappeared; while long-range signals (correlated signals between the guanine and the cytosine bases) could still be observed. Therefore, the NH . . . N hydrogen bond in RNA gel systems could be characterized using $^1$H-$^{15}$N TEDOR experiments.

Figure 3A:
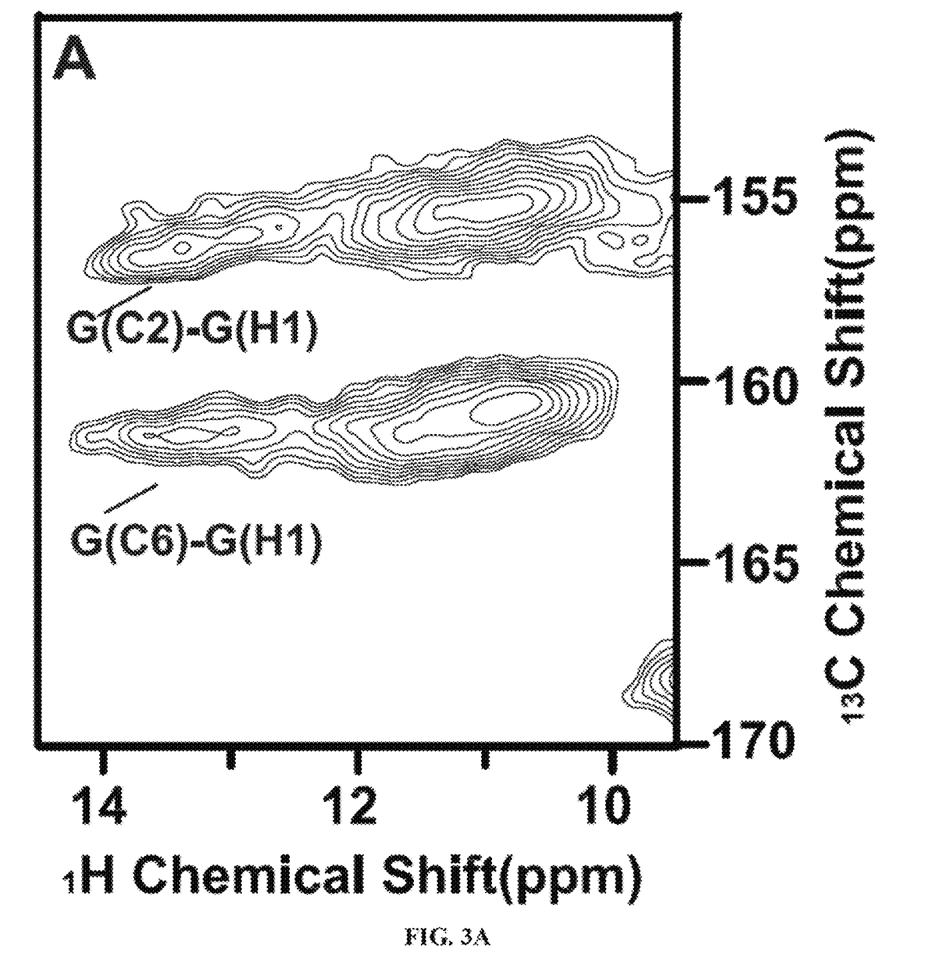
FIG. 3A shows a two-dimensional $^{1}H-^{13}C$ TEDOR spectrum of a $^{13}C,^{15}N$ isotopes-uniformly labeled (GGGGCC) sRNA gel with a total evolution time of 200 µs (n=2)
Figure 3B:
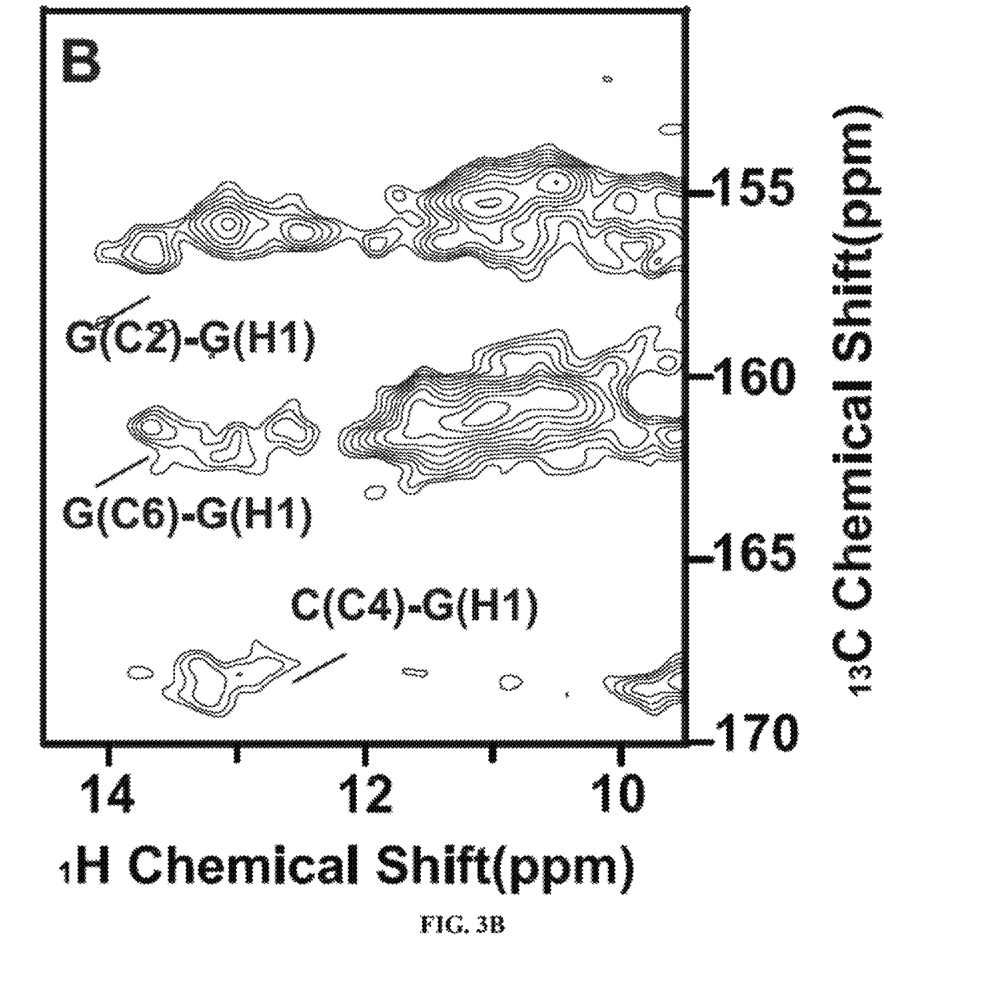
FIG. 3B shows a two-dimensional $^{1}H-^{13}C$ TEDOR spectrum of a $^{13}C,^{15}N$ isotopes-uniformly labeled (GGGGCC)$_5$ RNA gel with a total evolution time of 600 µs (n=6)
Figure 3C:
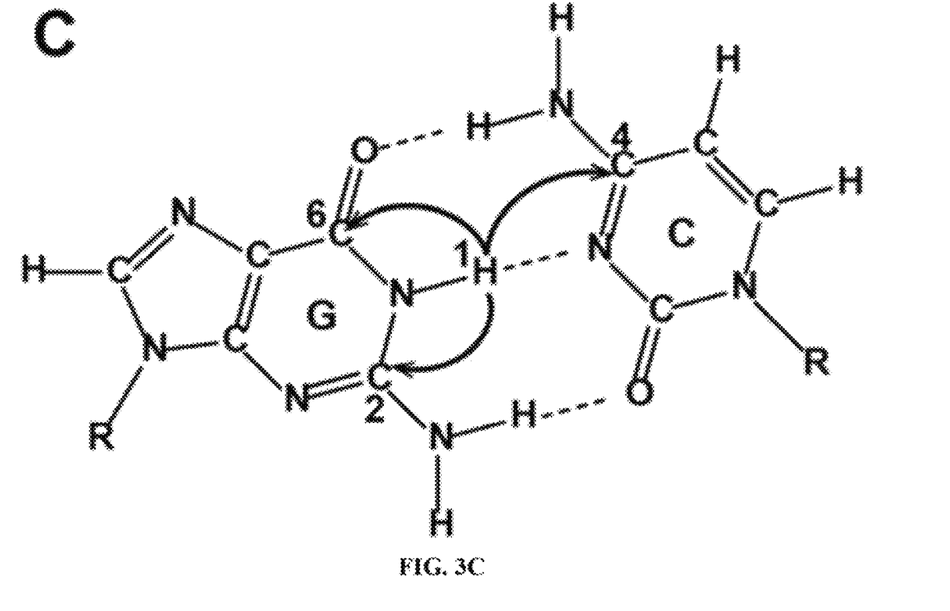
FIG. 3C shows a schematic diagram of a G-C paired structure.

In the present disclosure, two-dimensional $^1$H-$^{13}$C TEDOR spectra of $^{13}$C,$^{15}$N isotopes-uniformly labeled (GGGGCC)$_5$RNA gels were collected (FIG. 3A to FIG. 3B). The results were as follows: at a total evolution time of 300 μs (short mixing time), only signal peaks with $^1$H/$^{13}$C chemical shifts of 13 ppm/156 ppm and 13 ppm/161 ppm were observed, representing the C2-H1 and C6-H1 cross peaks, both being the intra guanine base CH signals. When the total evolution time was 700 μs, in addition to the internal cross peaks of the bases, the related information between the bases was observed, namely the signal peaks with $^1$H/$^{13}$C chemical shifts of 13 ppm/168 ppm, representing a cross peak of H1 in guanine base and C4 in cytosine base, and proving the existence of N—H . . . N hydrogen bond between G-C(FIG. 3C). Therefore, the hydrogen bond in RNA gel systems could be characterized using $^1$H-$^{13}$C TEDOR experiments.

Figure 4A:
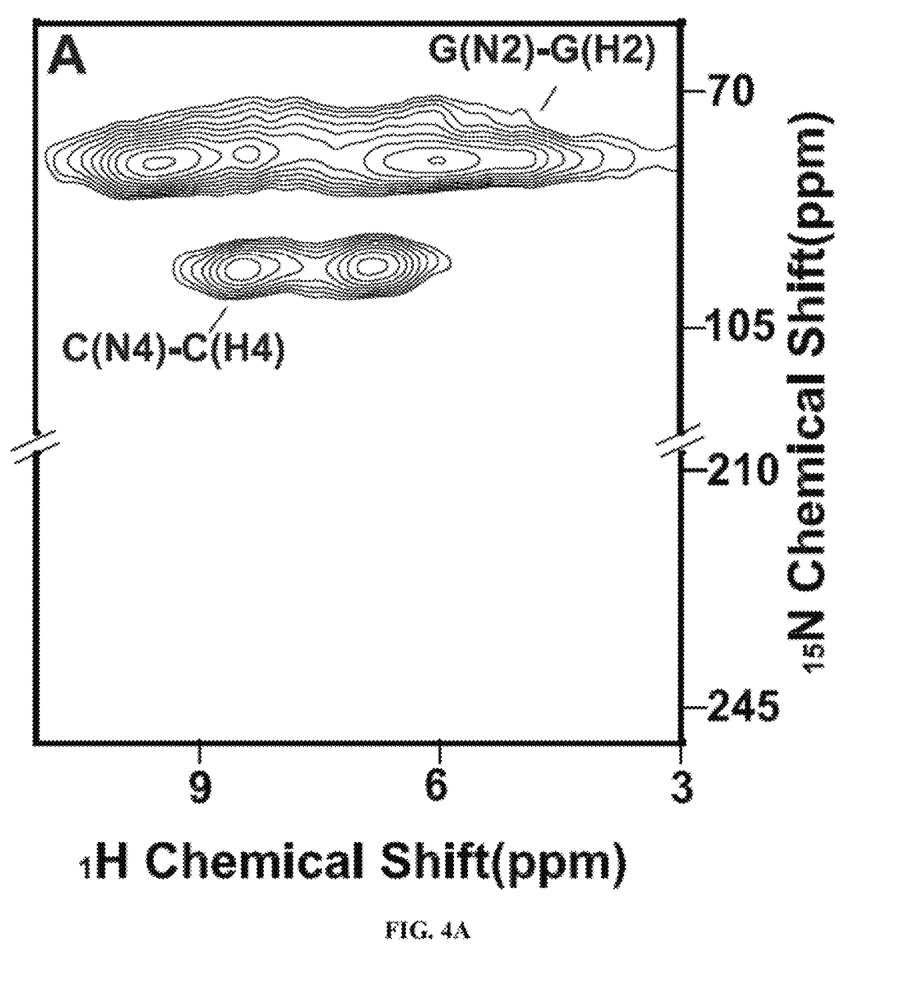
FIG. 4A shows a two-dimensional $^{1}H-^{15}N$-hNH-(FSL)-[$^{1}H,^{15}N$]-TEDOR spectrum of a $^{13}C,^{15}N$ isotopes-uniformly labeled (GGGQCC)sRNA gel with a total evolution time of 200 µs (n=2)
Figure 4B:
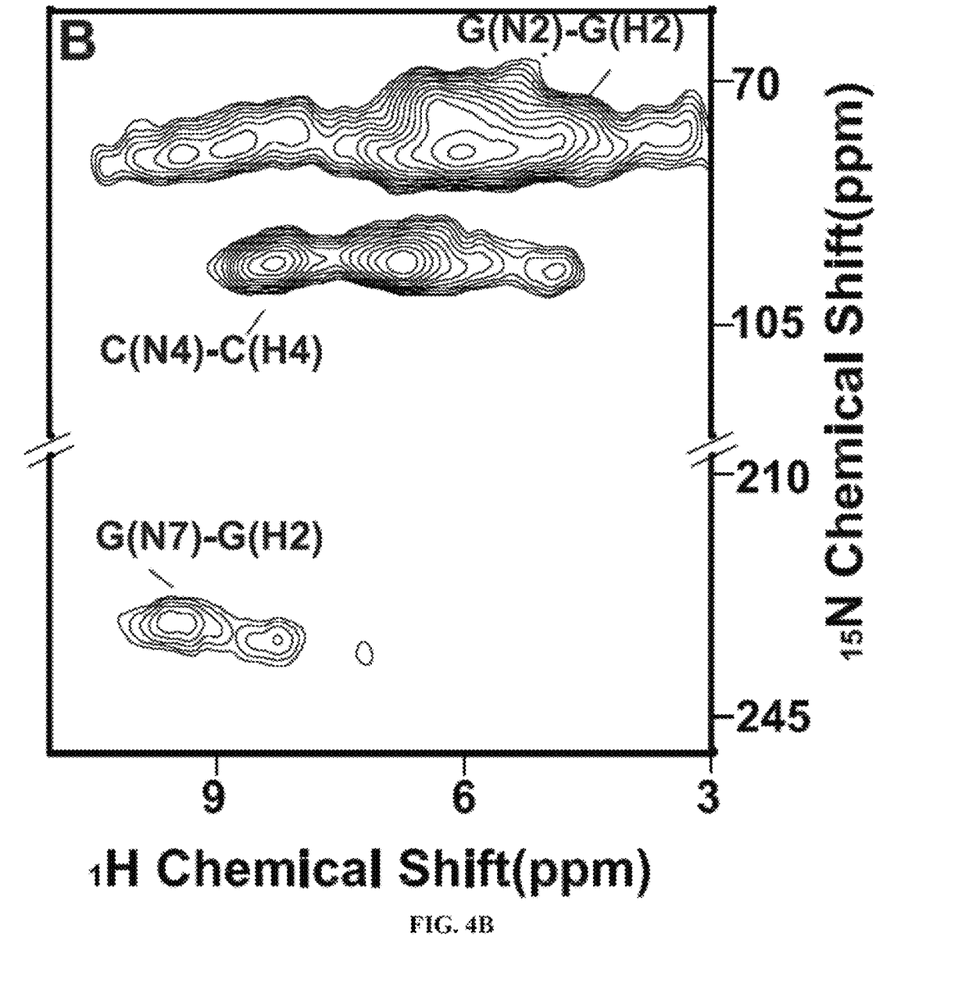
FIG. 4B shows a two-dimensional $^{1}H-^{15}N$-hNH-(FSL)-[$^{1}H,^{15}N$]-TEDOR spectrum of a $^{13}C,^{15}N$ isotopes-uniformly labeled (GGGGCC)$_5$RNA gel with a total evolution time of 600 µs (n=6)
Figure 4C:
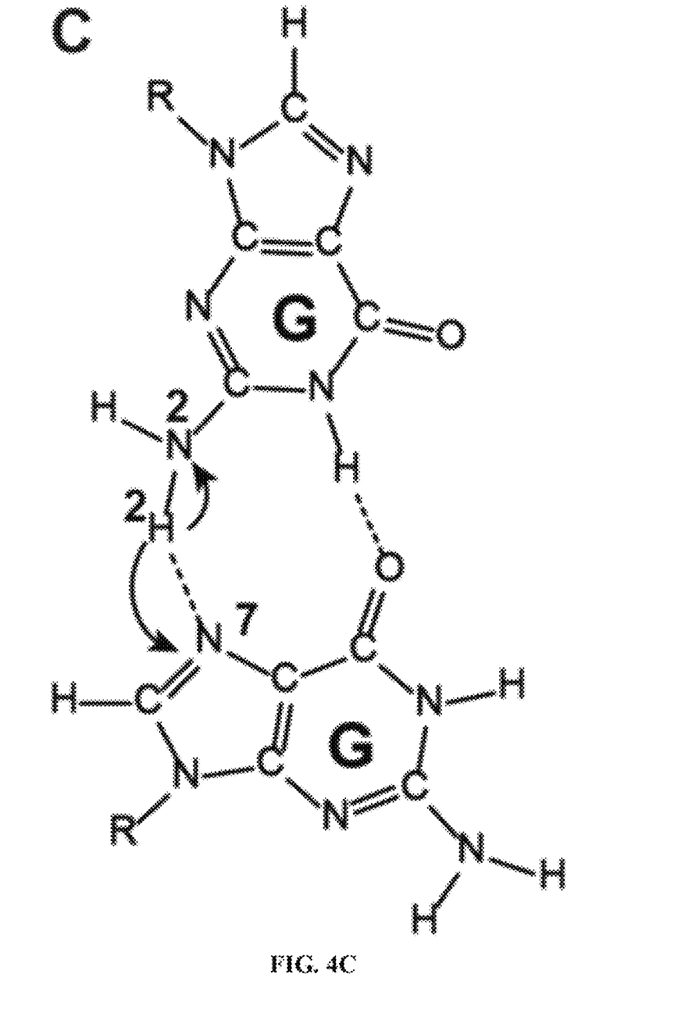
FIG. 4C shows a schematic diagram of a G-G paired structure.

In addition, in the present disclosure, two-dimensional 2D$^1$H-$^{15}$N-hNH-(FSL)-[$^1$H,$^{15}$N]-TEDOR spectra of $^{13}$C, $^{15}$N isotopes-uniformly labeled (GGGGCC)$_5$RNA gels were collected (FIG. 4A to FIG. 4B). The results were as follows: at a total evolution time of 200 μs (short mixing time), only signal peaks with $^1$H/$^{15}$N chemical shifts of 9 ppm/80 ppm and 8 ppm/80 ppm were observed, representing a N2-1.12 cross peak, namely the intra guanine base NH$_2$ signal. When the total evolution time was 600 μs, in addition to the internal cross peaks of the bases, the related information between bases was observed, namely the signal peaks with $^1$H/$^{15}$N chemical shifts of 9 ppm/232.7 ppm, representing a cross peak of H2 in G base and N7 paired to the guanine base, and demonstrating the existence of the N—H . . . N hydrogen bond between the G-G Hoogesteen base pairings (FIG. 4C).

Figure 5A:
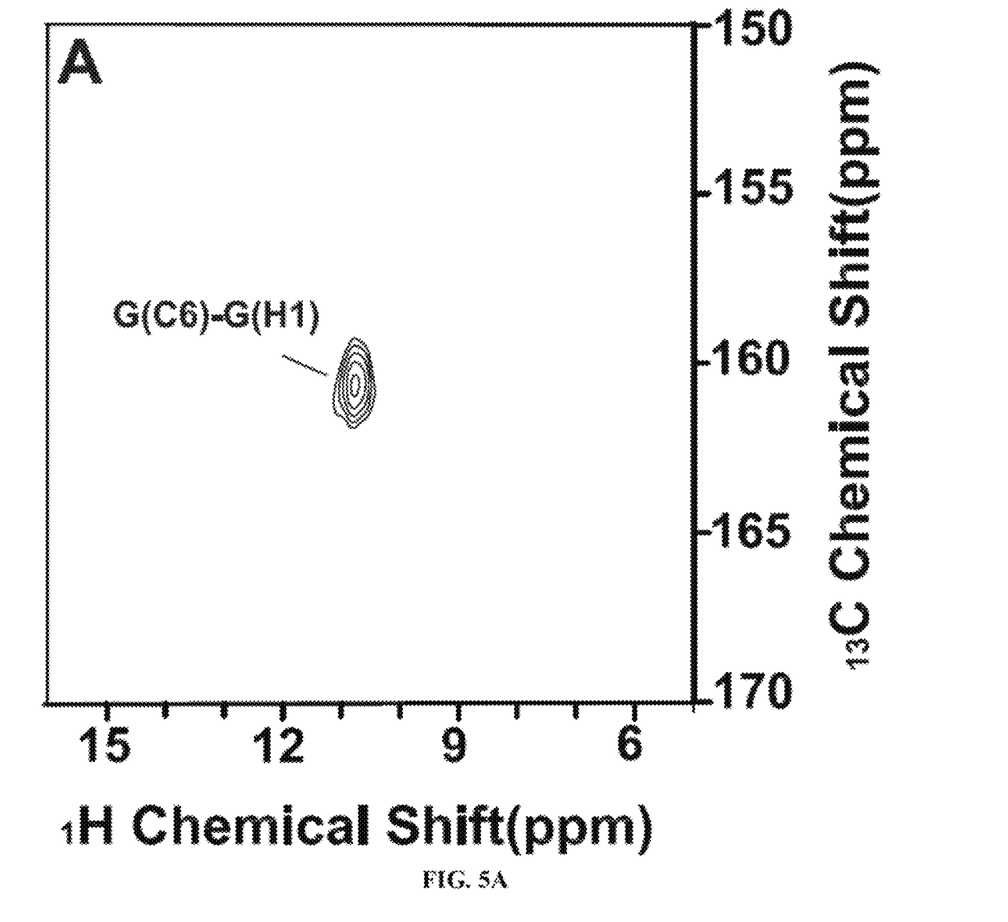
FIG. 5A shows a two-dimensional $^{1}H-^{13}C$-hNH-(FSL)-[$^{1}H,^{13}C$]-TEDOR spectrum of a mixed-labeled (GGGGCC)$_5$ RNA gel with a total evolution time of 600 µs (n=6)
Figure 5B:
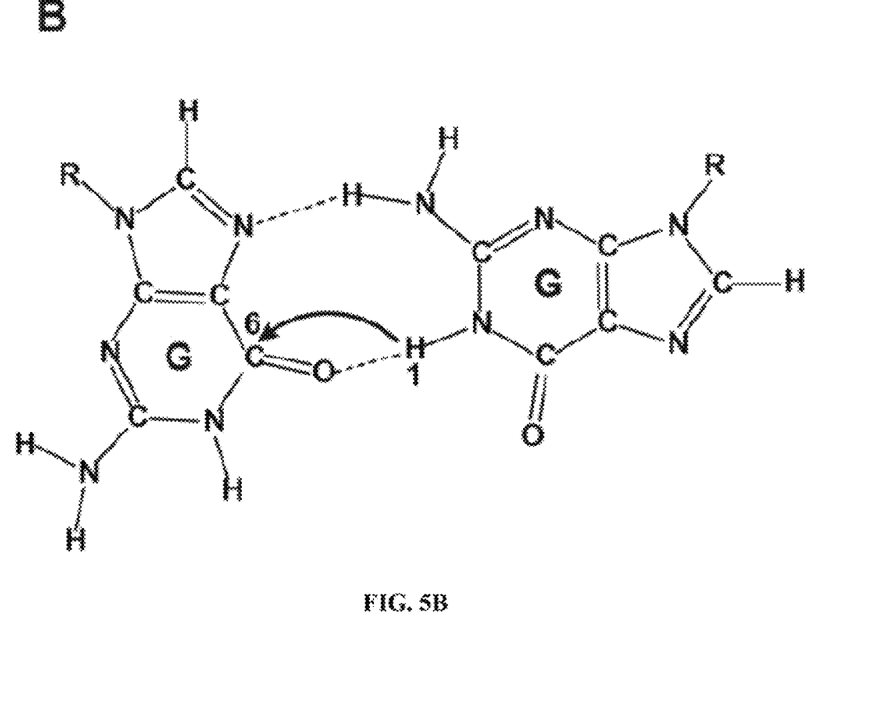
FIG. 5B shows a schematic diagram of a G-G paired structure.

In the present disclosure, two-dimensional 2D'H-$^{13}$C-hNH-(FSL)-[$^1$H,$^{13}$C]-TEDOR spectra of (GGGGCC)$_5$RNA gels were collected (FIG. 5A). The results were as follows: when the total evolution time was 600 μs (long mixing time), signal peaks with $^1$H/$^{13}$C chemical shifts of 10.78 ppm/160.9 ppm were observed, representing a cross peak of C6 in guanine base and H1 paired to the guanine base, and demonstrating the existence of N—H . . . O═C hydrogen bond between G-G pairings (FIG. 5B).

Compared with the prior art, the present disclosure has the following beneficial effects:

In the present disclosure, a $^1$H—X TEDOR pulse sequence is designed by combining proton-detected technology with transfer echo double resonance pulse technology, and a ssNMR method is established for specific detection of N—H . . . N or N—H . . . O═C hydrogen bond. TEDOR achieves coherent transfer through a heteronuclear recoupling method based on dipole coupling, and establishes $^1$H—X chemical shift correlations. In this experiment, in the $^1$H-XTEDOR method, after the excitation of $^1$H, π pulses are applied to the X channel every half rotation period. After several rotation cycles, dipole recoupling is achieved and the $^1$H magnetization convert to multi-quantum $^3$H—X coherence. The coupled $^1$H—X coherence is converted into a detectable $^1$H coherence through the second REDOR period, and the $^1$H chemical shift is recorded to complete the two-dimensional experiment. In the TEDOR method, the cross-peak intensity is related to the distance between two nuclei and the total mixing time of REDOR period. Through the TEDOR pulse experiment, the chemical shift correlation can be realized between $^1$H and the atoms on both sides in the N—H . . . N or N—H . . . O═C hydrogen bond; meanwhile, by adjusting the total time, the chemical shift correlation between the covalently bound N and H atoms, as well as the chemical shift correlation between X and H atoms connected by hydrogen bond can be identified.

In addition, in the present disclosure, the selective pulses, including the CP pulse and the frequency selective pulse, are combined with the TEDOR pulse for the first time, thus effectively reducing the spectral overlapping.

In the present disclosure, the method has the following advantages: (I) a proton detected technology is adopted with a high sensitivity; (2) a $^1$H-$^{15}$N two-dimensional spectrum is constructed to observe relevant signals with a high accuracy; (3) TEDOR pulse parameter setting is simple, without need to be optimized according to the angle and the bond length of the hydrogen bond; (4) acquisition of the $^1$H atoms is related to a chemical shift of two nitrogen atoms in the hydrogen bond, and the hydrogen bond can be directly observed at atomic level; (5) through the combination of selective pulses and TEDOR pulses, the overlapping of spectra is effectively reduced; and (6) in the N—H . . . N hydrogen bond, N—H connected by chemical bonds has a distance of about 1.0 Å, and H and N atoms connected by hydrogen bonds has a distance of about 1.9 Å. Therefore, with the $^1$H-$^{15}$N TEDOR experiment, by setting different mixing times, N—H groups connected by chemical bonds, as well as H and N atoms connected by hydrogen bonds, are detected for structural identification and characterization.

What is claimed is:

1. A solid-state nuclear magnetic resonance (ssNMR) method for detecting a hydrogen bond structure, comprising the following steps:
   (1) exciting a $^1$H nucleus of an RNA sample with a π/2 pulse;
   (2) applying two π pulses every half rotation period on an X nucleus of the RNA sample;
   (3) applying a n pulse on the $^1$H nucleus of the RNA sample;
   (4) applying two n pulses every half rotation period on the X nucleus of the RNA sample;
   (5) applying a 90° pulse on $^1$H and X atoms of the RNA sample;
   (6) recording a chemical shift of X in indirect dimension;
   (7) applying the 90° pulse on the $^1$H and X nuclei of the RNA sample;
   (8) repeating steps 2, 3, and 4; and
   (9) collecting the $^1$H signal in direct dimension; wherein X is selected from the group consisting of $^{15}$N and $^{13}$C.

2. The ssNMR method for detecting a hydrogen bond structure according to claim 1, wherein the $^1$H nucleus is applied with 1.9 μs of the π/2 pulse and 3.8 μs of the π pulse.

3. The ssNMR method for detecting a hydrogen bond structure according to claim 1, wherein the $^{15}$N nucleus is applied with 9.2 μs of the π pulse.

4. The ssNMR method for detecting a hydrogen bond structure according to claim 1, wherein the $^{13}$C nucleus is applied with 7.0 μs of the n pulse.

5. The ssNMR method for detecting a hydrogen bond structure according to claim 1, wherein
   the method further comprises the following steps between steps (1) and (2):
   applying $^1$H-$^{15}$N cross-polarization (CP);
   applying a shape pulse on the $^{15}$N nucleus;
   suppressing a water signal with a MISSISIPPI pulse sequence; and
   applying $^{15}$N-$^1$H CP.

6. The ssNMR method for detecting a hydrogen bond structure according to claim 5, wherein $^1$H-$^{15}$N CP is applied at a contact time of 1 ms, a $^{15}$N constant field lock at 50 kHz, and a $^1$H constant field lock at 90 kHz.

7. The ssNMR method for detecting a hydrogen bond structure according to claim 5, wherein the shape pulse is applied on the $^{15}$N nucleus at an excitation time of 625 Ns.

8. The ssNMR method for detecting a hydrogen bond structure according to claim 5, wherein $^{15}$N-$^1$H CP is applied at a contact time of 300 μs, a $^{15}$N constant field lock at 50 kHz, and a $^1$H constant field lock at 90 kHz.

9. The ssNMR method for detecting a hydrogen bond structure according to claim 5, wherein the shape pulse is selected from the group consisting of Q3, GAUSS, SQUARE, SINC, RSONB, REBurp, CRP, and REBURP.

10. The ssNMR method for detecting a hydrogen bond structure according to claim 2, wherein
    the method further comprises the following steps between steps (1) and (2):
    applying $^1$H-$^{15}$N CP;
    applying a shape pulse on the $^{15}$N nucleus;
    suppressing a water signal with a MISSISIPPI pulse sequence; and
    applying $^{15}$N-$^1$H CP.

11. The ssNMR method for detecting a hydrogen bond structure according to claim 3, wherein
    the method further comprises the following steps between steps (1) and (2):
    applying $^1$H-$^{15}$N CP;
    applying a shape pulse on the $^{15}$N nucleus;
    suppressing a water signal with a MISSISIPPI pulse sequence; and
    applying $^{15}$N-$^1$H CP.

12. The ssNMR method for detecting a hydrogen bond structure according to claim 4, wherein
    the method further comprises the following steps between steps (1) and (2):
    applying $^1$H-$^{15}$N CP;
    applying a shape pulse on the $^{15}$N nucleus;
    suppressing a water signal with a MISSISIPPI pulse sequence; and
    applying $^{15}$N-$^1$H CP.

13. The ssNMR method for detecting a hydrogen bond structure according to claim 10, wherein $^1$H-$^{15}$N CP is applied at a contact time of 1 ms, a $^{15}$N constant field lock at 50 kHz, and a $^1$H constant field lock at 90 kHz.

14. The ssNMR method for detecting a hydrogen bond structure according to claim 11, wherein $^1$H-$^{15}$N CP is applied at a contact time of 1 ms, a 15N constant field lock at 50 kHz, and a $^1$H constant field lock at 90 kHz.

15. The ssNMR method for detecting a hydrogen bond structure according to claim 12, wherein $^1$H-$^{15}$N CP is applied at a contact time of 1 ms, a $^{15}$N constant field lock at 50 kHz, and a $^1$H constant field lock at 90 kHz.

16. The ssNMR method for detecting a hydrogen bond structure according to claim 10, wherein the shape pulse is applied on the $^{15}$N nucleus at an excitation time of 625 μs.

17. The ssNMR method for detecting a hydrogen bond structure according to claim 11, wherein the shape pulse is applied on the $^{15}$N nucleus at an excitation time of 625 μs.

18. The ssNMR method for detecting a hydrogen bond structure according to claim 12, wherein the shape pulse is applied on the $^{15}$N nucleus at an excitation time of 625 μs.

19. The ssNMR method for detecting a hydrogen bond structure according to claim 10, wherein $^{15}$N-$^1$H CP is applied at a contact time of 300 μs, a $^{15}$N constant field lock at 50 kHz, and a $^1$H constant field lock at 90 kHz.

20. The ssNMR method for detecting a hydrogen bond structure according to claim 11, wherein $^{15}$N-$^1$H CP is applied at a contact time of 300 μs, a $^{15}$N constant field lock at 50 kHz, and a $^1$H constant field lock at 90 kHz.

* * * * *